US012237324B2

(12) United States Patent
Lee et al.

(10) Patent No.: US 12,237,324 B2
(45) Date of Patent: Feb. 25, 2025

(54) INTEGRATED CIRCUIT DEVICE

(71) Applicant: Samsung Electronics Co., Ltd., Suwon-si (KR)

(72) Inventors: Jangeun Lee, Hwaseong-si (KR); Minjoo Lee, Anyang-si (KR); Eunyoung Lee, Hwaseong-si (KR); Minsik Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 196 days.

(21) Appl. No.: 18/052,726

(22) Filed: Nov. 4, 2022

(65) Prior Publication Data
US 2023/0146530 A1    May 11, 2023

(30) Foreign Application Priority Data

Nov. 9, 2021    (KR) .................. 10-2021-0153342

(51) Int. Cl.
*H10B 12/00* (2023.01)
*H01L 21/02* (2006.01)
*H01L 27/06* (2006.01)

(52) U.S. Cl.
CPC .... *H01L 27/0605* (2013.01); *H01L 21/02181* (2013.01); *H01L 21/02189* (2013.01); *H01L 21/02194* (2013.01); *H10B 12/315* (2023.02); *H10B 12/482* (2023.02); *H10B 12/485* (2023.02)

(58) Field of Classification Search
CPC .......... H01L 27/0605; H01L 21/02181; H01L 21/02189; H01L 21/02194; H10B 12/315; H10B 12/482; H10B 12/485
See application file for complete search history.

(56) References Cited

U.S. PATENT DOCUMENTS

| | | | |
|---|---|---|---|
| 5,804,853 A | 9/1998 | Cronin et al. | |
| 5,913,100 A | 6/1999 | Kohsaka et al. | |
| 6,770,527 B2 | 8/2004 | Shukuri et al. | |
| 7,122,870 B2 | 10/2006 | Barnak et al. | |
| 7,554,147 B2 | 6/2009 | Asano et al. | |
| 8,492,270 B2 | 7/2013 | Ponoth et al. | |
| 8,748,263 B2 * | 6/2014 | Kim ................ | H10B 12/053 257/532 |
| 2007/0045854 A1 | 3/2007 | Lim et al. | |

(Continued)

FOREIGN PATENT DOCUMENTS

| | | |
|---|---|---|
| JP | 3346794 B2 | 11/2002 |
| TW | 360926 B | 6/1999 |
| TW | 481845 B | 4/2002 |

OTHER PUBLICATIONS

Office Action dated Jun. 16, 2023, issued in corresponding Taiwanese Patent Application No. 111142150.

*Primary Examiner* — David Vu
(74) *Attorney, Agent, or Firm* — HARNESS, DICKEY & PIERCE, P.L.C.

(57) ABSTRACT

An integrated circuit device according may include a plurality of gate structures embedded in a substrate, a direct contact on the substrate between the plurality of gate structures, and a bit line electrode layer on the direct contact. The bit line electrode layer has a thickness of about 10 nm to 30 nm. The bit line electrode layer may include a molybdenum tungsten (MoW) alloy including molybdenum (Mo) a range of about 25 at % to about 75 at %.

20 Claims, 15 Drawing Sheets

(56) References Cited

U.S. PATENT DOCUMENTS

| | | |
|---|---|---|
| 2008/0197392 A1 | 8/2008 | Sakoh et al. |
| 2019/0386010 A1 | 12/2019 | Tomoyama |
| 2021/0098460 A1 | 4/2021 | Lee et al. |
| 2021/0134804 A1 | 5/2021 | Jung et al. |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0153342, filed on Nov. 9, 2021 in the Korean Intellectual Property Office, the disclosure of which is incorporated by reference herein in its entirety.

BACKGROUND

Inventive concepts relate to an integrated circuit device, and more particularly, to an integrated circuit device including a word line and a bit line.

Recently, as the degree of integration of integrated circuit devices has gradually increased, a structure of an integrated circuit device having a buried channel array transistor (BCAT), in which a plurality of word lines are buried in a substrate, has been proposed. Accordingly, various studies are being conducted to improve and stabilize the operation and reliability of the BCAT. In particular, as a design rule of an integrated circuit device is rapidly reduced, a line width of a metal wiring constituting a bit line is also rapidly reduced.

SUMMARY

Inventive concepts relate to improving electrical characteristics and product reliability by controlling a component of a metal material constituting a bit line electrode layer in an integrated circuit device including a buried channel array transistor.

Features, aspects, and/or effects from embodiments of inventive concepts are not limited to those mentioned above, and other features, aspects, and/or effects not mentioned will be clearly understood by those skilled in the art from the following description.

According to an embodiment of inventive concepts, an integrated circuit device may include a plurality of gate structures embedded in a substrate; a direct contact on the substrate between the plurality of gate structures; and a bit line electrode layer on the direct contact. The bit line electrode layer may have a thickness of about 10 nm to 30 nm, and the bit line electrode layer may include a molybdenum tungsten (MoW) alloy including molybdenum (Mo) in a range of about 25 at % to about 75 at %.

According to another embodiment of inventive concepts, an integrated circuit device may include a plurality of gate structures embedded in a substrate; a direct contact on the substrate between the plurality of gate structures; and a bit line electrode layer on the direct contact. The bit line electrode layer may be a superlattice alloy including a plurality of molybdenum (Mo) layers and a plurality of tungsten (W) layers alternately disposed. The superlattice alloy may include Mo in a range from about 25 at % to about 75 at %.

According to another embodiment of inventive concepts, an integrated circuit device may include a plurality of gate structures embedded in a substrate; a direct contact on the substrate and vertically aligned with the substrate between the plurality of gate structures; and a bit line structure on the direct contact. The bit line structure may include a bit line barrier layer, a bit line electrode layer, and a bit line capping layer. Each of the plurality of gate structures may include a gate trench in the substrate, a gate insulating layer conformally on an inner wall of the gate trench, a gate electrode pattern on the gate insulating layer and filling a lower region of the gate trench, and a gate capping layer on the gate insulating layer and filling an upper region of the gate trench. The bit line electrode layer may have a thickness of about 10 nm to about 30 nm. The bit line electrode layer may include a molybdenum tungsten (MoW) alloy including molybdenum (Mo) in range of about 25 at % to about 75 at %.

BRIEF DESCRIPTION OF THE DRAWINGS

Embodiments of inventive concepts will be more clearly understood from the following detailed description taken in conjunction with the accompanying drawings in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments of inventive concepts will be described in detail with reference to the accompanying drawings.

Figure 1:
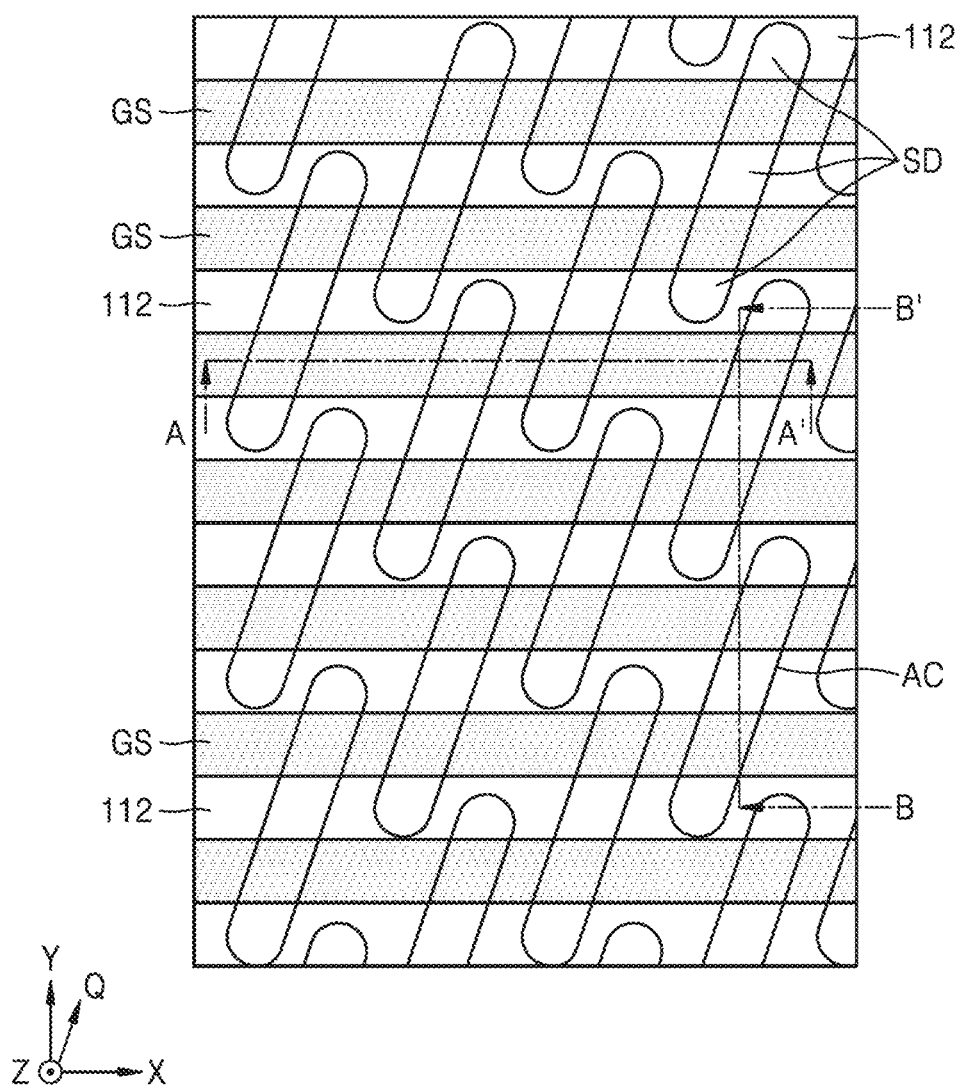
FIG. 1 is a plan view showing a main configuration of an integrated circuit device according to an embodiment of inventive concepts.
Figure 2:
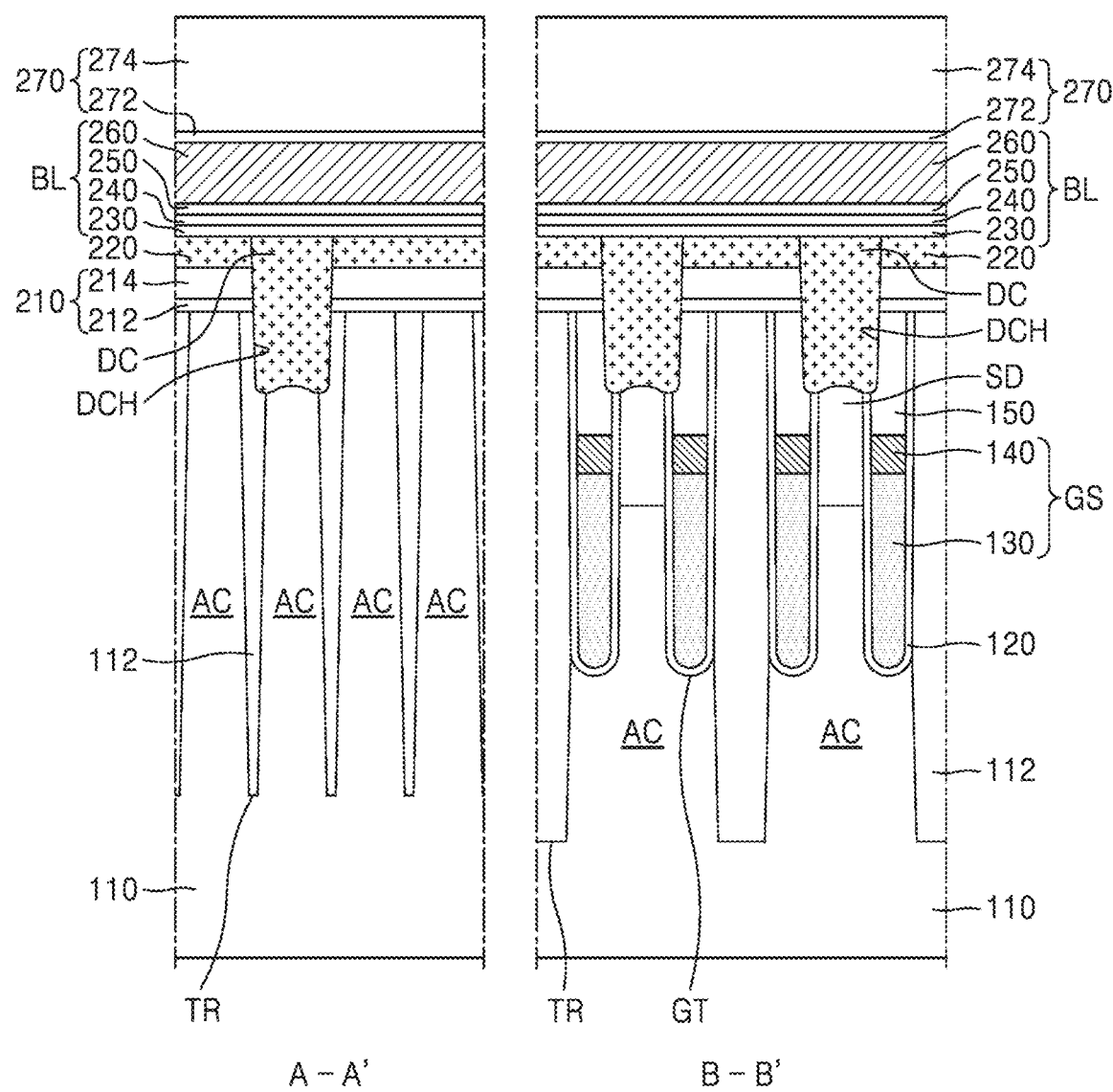
FIG. 2 is a cross-sectional view showing a main configuration taken along lines A-A' and B-B' of FIG. 1.
Figure 3:
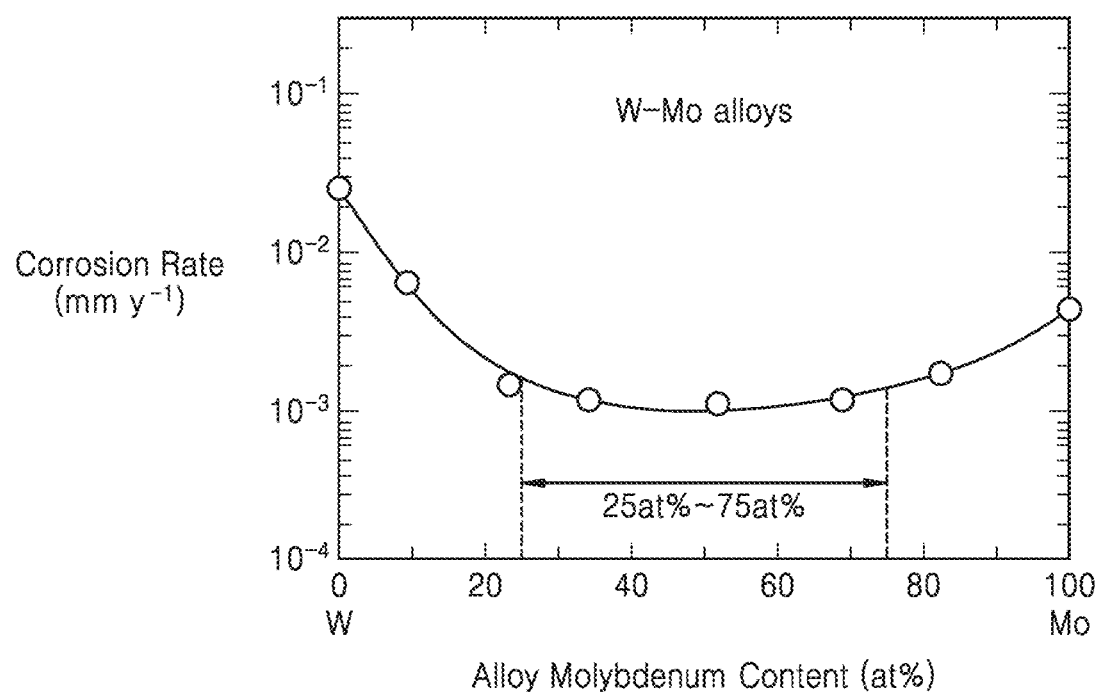
FIG. 3 is a graph illustrating a relationship between a material constituting a bit line electrode layer of FIG. 2 and a degree of corrosion.

FIG. 1 is a plan view showing the main configuration of an integrated circuit device according to an embodiment of inventive concepts, FIG. 2 is a cross-sectional view showing the main configuration taken along lines A-A' and B-B' of FIG. 1, and FIG. 3 is a graph illustrating a relationship between a material constituting a bit line electrode layer of FIG. 2 and a degree of corrosion.

Referring to FIGS. 1 to 3 together, an integrated circuit device 100 includes a substrate 110 having a plurality of active regions AC defined by a device isolation film 112 and a plurality of gate trenches GT extending across the plurality of active regions AC.

The substrate 110 may be a wafer including silicon (Si). In some embodiments, the substrate 110 may be a wafer including a semiconductor element such as germanium (Ge), or a compound semiconductor such as silicon carbide (SiC), gallium arsenide (GaAs), indium arsenide (InAs), or indium phosphide (InP). Moreover, the substrate 110 may have a silicon on insulator (SOI) structure. In addition, the substrate 110 may include a conductive region, for example, a well doped with an impurity or a structure doped with an impurity.

A plurality of active regions AC may be repeatedly formed apart from each other in the X and Y directions, and may have a shape extending in an oblique direction to have a long axis in one direction (Q direction) that is different from both the X direction and the Y direction. The plurality of gate trenches GT may have a plurality of line shapes extending parallel to each other in the X direction.

The device isolation film 112 may be arranged to define a plurality of active regions AC in the substrate 110. The device isolation film 112 may include a silicon oxide film, a silicon nitride film, or a combination thereof. The device isolation films 112 may extend in the X direction on the substrate 110 and may be apart from each other in the Y direction.

A gate dielectric film 120 may be formed in each of the plurality of gate trenches GT, a gate electrode 130 filling a portion of the gate trench GT may be formed on the gate dielectric layer 120, a gate protective film 140 covering the gate electrode 130 may be formed in the gate trench GT, and a gate capping film 150 on the gate protective film 140 may be formed in the gate trench GT. Among them, the gate electrode 130 and the gate protective film 140 may constitute a gate structure GS.

The level of the portion where the substrate 110 is exposed from the bottom of the gate trench GT may be higher than the level of the portion where the device isolation film 112 is exposed. Accordingly, the bottom surface of the gate structure GS may have a concave-convex shape corresponding to the bottom profile of the plurality of gate trenches GT. Accordingly, a saddle fin field-effect transistor (FinFET) may be formed in the plurality of active regions AC. The gate dielectric film 120 covers the inner surface of the gate trench GT so as to be in contact with the active region AC and the device isolation film 112. The gate dielectric film 120 may include a silicon oxide film, a silicon nitride film, a silicon oxynitride film, an oxide/nitride/oxide (ONO) film, or a high-k dielectric film having a higher dielectric constant than that of a silicon oxide film. The high-k dielectric film may have a dielectric constant of about 10 to 25, and may include $HfO_2$, $Al_2O_3$, $HfAlO_3$, $Ta_2O_3$, or $TiO_2$.

The gate electrode 130 may be formed of a metal, a metal nitride, a metal carbide, or a combination thereof. In some embodiments, the gate electrode 130 may be formed of Ti, TiN, Ta, TaN, W, WN, TiSiN, WSiN, or a combination thereof.

The gate protective film 140 may be arranged on the gate electrode 130. Specifically, the gate protective film 140 is arranged between the gate electrode 130 and the gate capping film 150. The gate protective film 140 may limit and/or prevent mutual diffusion or reaction of different materials constituting both the gate electrode 130 and the gate capping film 150. The gate protective film 140 may be made of, for example, polysilicon.

The gate capping film 150 fills the inside of the gate trench GT so as to be in contact with the gate dielectric film 120. The gate capping film 150 may include a silicon nitride film, a silicon oxynitride film, or a combination thereof. That is, the gate capping film 150 may be formed of a material that is different from that of the gate dielectric film 120.

The gate structure GS has gate sidewalls facing the active region AC, and the gate capping film 150 includes insulating sidewall portions facing the active region AC. Source/drain regions SD may be formed on both sides of the gate structure GS in the plurality of active regions AC.

The plurality of gate structures GS may constitute a plurality of word lines. That is, the plurality of word lines may extend parallel to each other in the X direction across the plurality of active regions AC. A plurality of bit lines BL may extend parallel to each other in the Y direction on the plurality of word lines. The plurality of bit lines BL may be connected to the plurality of active regions AC through direct contacts DC.

An interlayer insulating film 210 may include a first interlayer insulating film 212 and a second interlayer insulating film 214 sequentially formed on the substrate 110. The first interlayer insulating film 212 and the second interlayer insulating film 214 may be made of different types of insulating materials. For example, the first interlayer insulating film 212 may include a silicon oxide film, and the second interlayer insulating film 214 may include a silicon nitride film, but inventive concepts is not limited thereto.

An interlayer conductive film 220 may be made of doped polysilicon. In addition, the direct contact DC may be formed of doped polysilicon. In some embodiments, the interlayer conductive film 220 and the direct contact DC may be formed of polysilicon having different doping concentrations.

The direct contact DC may be formed to fill the inside of a direct contact hole DCH. The direct contact hole DCH is formed by etching a partial region of the interlayer insulating film 210 and the interlayer conductive film 220 and a partial region of the substrate 110 so that the direct contact hole DCH may be formed to penetrate the interlayer insulating film 210 and the interlayer conductive film 220 to expose the active region AC.

A bit line silicide layer (not shown) and a bit line barrier layer 230 may be sequentially included on the interlayer conductive film 220. The bit line silicide layer (not shown) may be formed of metal silicide. The bit line barrier layer 230 may be formed of TiSiN, TiN, TaN, CoN, metal, metal silicide, or a combination thereof. The metal and the metal silicide may include W, Mo, Au, Cu, Al, Ni, or Co, but inventive concepts is not limited thereto.

In the integrated circuit device 100 of inventive concepts, an amorphous metal layer 240 and a seed layer 250 may be sequentially included on the bit line barrier layer 230. The amorphous metal layer 240 and the seed layer 250 may be additional material layers to efficiently grow a metal material constituting a bit line electrode layer 260 to be described later. In some embodiments, the amorphous metal layer 240 and the seed layer 250 may be omitted.

The amorphous metal layer 240 may be any one selected from $WB_x$, $MoB_x$, $MoWB_x$, $TaB_x$, $NbB_x$, $HfB_x$, $ZrB_x$, and $CoB_x$. In order to efficiently control the orientation and grain size of the seed layer 250 disposed on the amorphous metal layer 240, the amorphous metal layer 240 may be formed to a thickness of about 0.5 nm to about 5 nm.

In addition, the seed layer 250 may be any one selected from Mo, W, MoW, MoTa, and MoWTa. In order to efficiently control the orientation and grain size of the bit line electrode layer 260 disposed on the seed layer 250, the seed layer 250 may be formed to a thickness of about 1 nm to about 10 nm.

In the integrated circuit device 100 of inventive concepts, a bit line electrode layer 260 is disposed on the seed layer 250. As a material for forming the bit line electrode layer 260, a molybdenum tungsten (MoW) alloy, which is a binary perfect solid solution, may be used. Here, the bit line barrier layer 230, the amorphous metal layer 240, the seed layer 250, and the bit line electrode layer 260 may constitute the bit line BL.

Specifically, during the alloying process of molybdenum (Mo) and tungsten (W), a molybdenum tungsten (MoW) alloy is a perfect solid solution capable of forming an alloy in all compositions, and shows the average sum of the resistivity of each material in proportion to each composition. In addition, in the process of forming the MoW alloy, since the growth of beta W having a relatively high particular resistance may be controlled, it has a characteristic that it is easy to secure a low particular resistance. In addition, the MoW alloy has a property that corrosion resistance is improved by about 4 to 20 times than that of each material.

As shown in FIG. 3, while satisfying the above characteristics, in particular, the composition ratio of the MoW alloy may be used in an alloy section in which corrosion resistance is strong. That is, the MoW alloy used for the bit line electrode layer 260 may be formed to include about 25 at % to about 75 at % of Mo. In addition, the thickness of the MoW alloy used as the bit line electrode layer 260 may be adjusted in a range of about 10 nm to about 30 nm considering the resistance, capacitance, and process difficulty of the metal wiring. Details of the method of manufacturing such a MoW alloy will be described later.

A bit line capping layer 270 may include a first bit line capping layer 272 and a second bit line capping layer 274 sequentially formed on the bit line electrode layer 260. In some embodiments, the first bit line capping layer 272 and the second bit line capping layer 274 may be formed of the same type of insulating material. For example, the first bit line capping layer 272 and the second bit line capping layer 274 may include a silicon nitride layer. In other embodiments, the first bit line capping layer 272 and the second bit line capping layer 274 may be formed of different types of insulating materials. For example, the first bit line capping layer 272 may include a silicon oxide film, and the second bit line capping layer 274 may include a silicon nitride film.

Recently, as the design rule of the integrated circuit device 100 is rapidly reduced, the line width of the metal wiring is also rapidly reduced. Accordingly, compared with the first resistivity of the metal wiring predicted through the resistivity measurement of the non-pattern wafer, the second resistivity of the metal wiring measured after patterning with a fine line width is much greater. As the line width of the metal wiring sharply decreases, in addition to increasing the resistivity of the damage layer itself formed during the metal etching process, the surface scattering effect due to surface damage is accelerated, and it is analyzed that the resistance of the metal wiring is rapidly increased.

In particular, as the line width of the bit line BL decreases, a characteristic (e.g., oxidation) that is vulnerable to a corrosion environment of W used as a conventional metal wiring is analyzed as a cause of a rapid increase in resistance. Accordingly, there is a demand for a material having low resistance and corrosion resistance to replace W in the process of forming the bit line BL. In addition, as the bit line BL sharply decreases in length, a material having a short electron mean free path and an easy etching process may be required.

In the integrated circuit device 100 of inventive concepts, by applying a MoW alloy, which is a material satisfying the above requirements, to the bit line electrode layer 260, it has the effect of being able to achieve electrical characteristics, process easiness, and price competitiveness. As a result, in embodiments of inventive concepts, a MoW alloy is applied as a material constituting the bit line BL in the ultra-fine metal wiring process of the integrated circuit device 100, so that it is possible to limit and/or prevent rapid resistance increase due to corrosion occurring in W single metal.

Ultimately, according to inventive concepts, in an integrated circuit device 100 including a buried channel array transistor, by using a MoW alloy as a metal material constituting the bit line electrode layer 260, there is the effect of improving electrical characteristics and product reliability.

Figure 4:
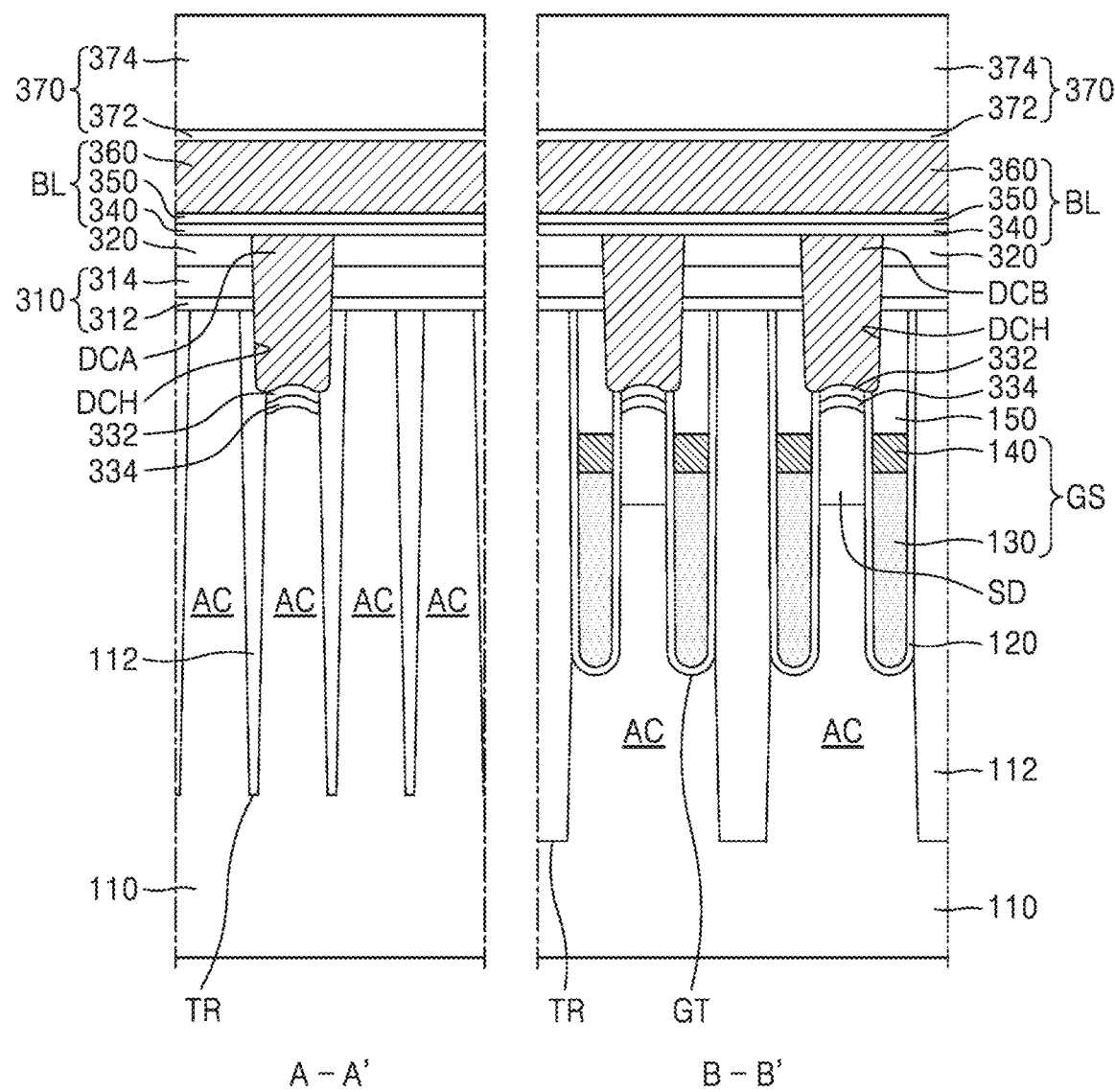
FIG. 4 is a cross-sectional view showing a main configuration of an integrated circuit device according to an embodiment of inventive concepts.

FIG. 4 is a cross-sectional view showing a main configuration of an integrated circuit device according to an embodiment of inventive concepts. The cross-sectional view in FIG. 4 may be taken along lines A-A' and B-B' of FIG. 1.

Most components constituting an integrated circuit device 100A described below and materials constituting the components are substantially the same as or similar to those described above with reference to FIGS. 1 to 3. Therefore, for convenience of description, the description will focus on differences from the integrated circuit device 100 described above.

Referring to FIG. 4, the cell array region of the integrated circuit device 100A may include a plurality of active regions AC. The plurality of bit lines BL may extend parallel to each other in the Y direction. The plurality of bit lines BL may be respectively connected to the plurality of active regions AC through direct contacts DCA.

In the integrated circuit device 100A of this embodiment, the direct contact DCA may be made of a metal material, and the metal material may be any one selected from Mo, W, MoW, and TiN. The direct contact DCA may be formed to fill the inside of the direct contact hole DCH. A direct contact hole DCH is formed by etching a partial region of the interlayer insulating film 310 and the interlayer conductive film 320 and a partial region of the substrate 110 so that the direct contact hole DCH may be formed to penetrate the interlayer insulating film 310 and the interlayer conductive film 320 to expose the active region AC.

In the integrated circuit device 100A of the present embodiment, a contact barrier layer 332 and a contact silicide layer 334 may be further formed between the substrate 110 and the direct contact DCA. The contact barrier layer 332 may be formed of TiSiN, TiN, TaN, CoN, metal, metal silicide, or a combination thereof. The metal and the metal silicide may include W, Mo, Au, Cu, Al, Ni, or Co. In addition, the contact silicide layer 334 may be formed of W silicide, Mo silicide, or titanium (Ti) silicide, but is not limited thereto.

In the integrated circuit device 100A of inventive concepts, the amorphous metal layer 340 and the seed layer 350 may be sequentially included on the bit line barrier layer 320. The bit line bonding layer 340 and the seed layer 350 may be additional material layers to efficiently grow a metal material constituting the bit line electrode layer 360. In some embodiments, the seed layer 350 may be omitted.

In the integrated circuit device 100A of the present embodiment, the bit line electrode layer 360 is disposed on the seed layer 350. As a material for forming the bit line electrode layer 360, a MoW alloy, which is a binary perfect solid solution, may be used. A bit line capping layer 370 may include a first bit line capping layer 372 and a second bit line capping layer 374 sequentially formed on the bit line electrode layer 360. Here, the bit line bonding layer 340, the seed layer 350, and the bit line electrode layer 360 may constitute the bit line BL.

Figure 5:
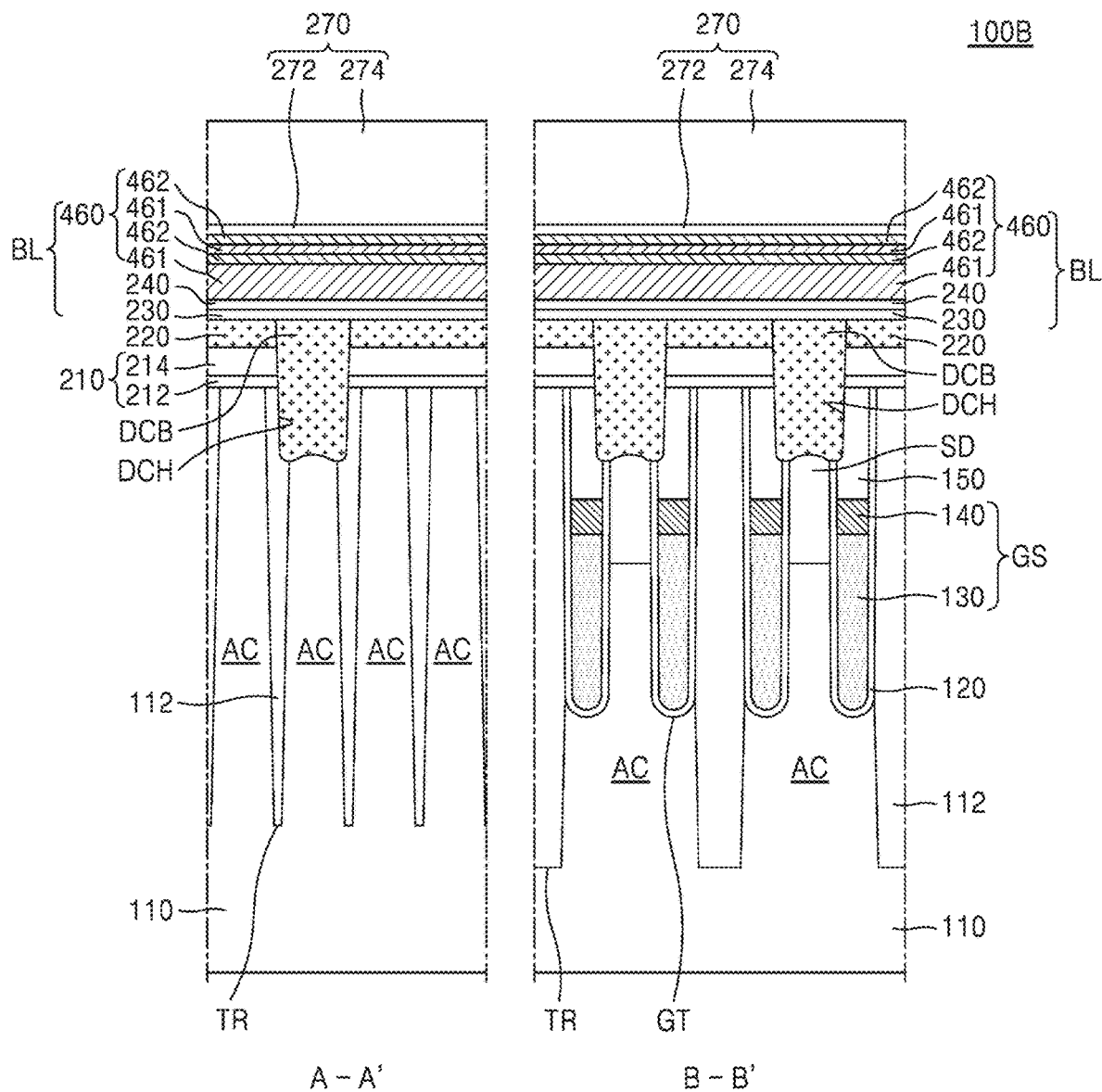
FIG. 5 is a cross-sectional view illustrating a main configuration of an integrated circuit device according to an embodiment of inventive concepts.
Figure 6:
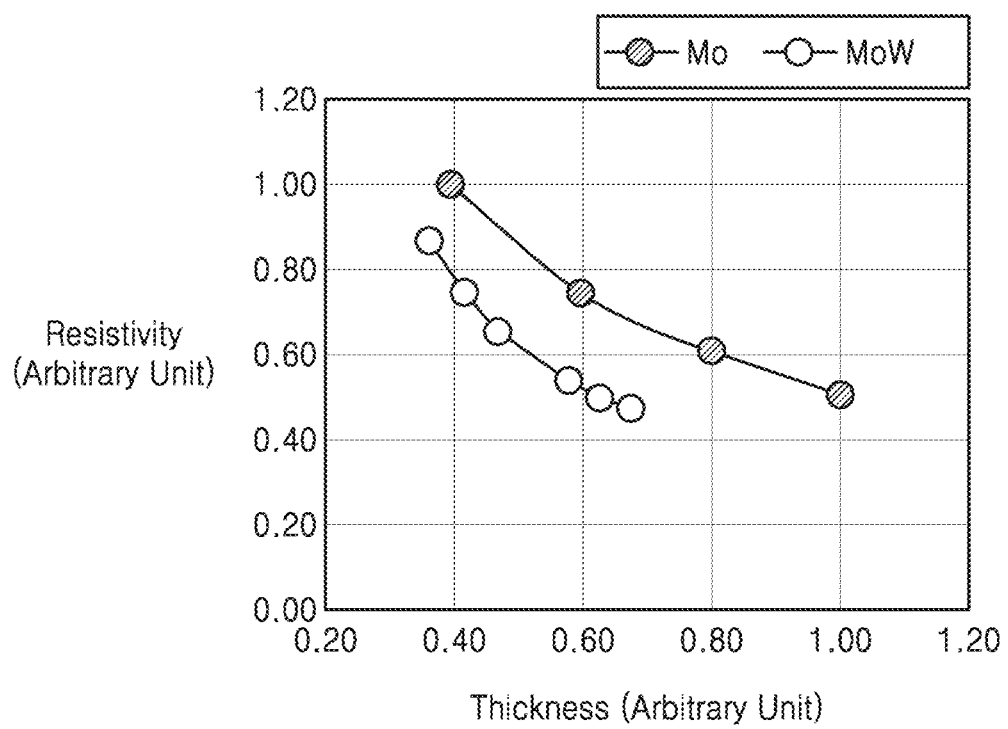
FIG. 6 is a graph illustrating a relationship between a material constituting a bit line electrode layer of FIG. 5 and a particular resistance.

FIG. 5 is a cross-sectional view showing the main configuration of an integrated circuit device according to an embodiment of inventive concepts, and FIG. 6 is a graph illustrating a relationship between a material constituting the bit line electrode layer of FIG. 5 and a particular resistance. The cross-sectional view in FIG. 5 may be taken along lines A-A' and B-B' of FIG. 1.

Most components constituting the integrated circuit device 100B described below and materials constituting the components are substantially the same as or similar to those described above with reference to FIGS. 1 to 3. Therefore, for convenience of description, the description will focus on differences from the integrated circuit device 100 described above.

Referring to FIGS. 5 and 6 together, the cell array region of the integrated circuit device 100B may include a plurality of active regions AC. The plurality of bit lines BL may extend parallel to each other in the Y direction. The plurality of bit lines BL may be connected to the plurality of active regions AC through direct contacts DC.

In the integrated circuit device 100B of the present embodiment, the amorphous metal layer 240 may be on the bit line barrier layer 230. The amorphous metal layer 240 may be an additional material layer to efficiently grow a metal material constituting a bit line electrode layer 460. In some embodiments, the amorphous metal layer 240 may be omitted.

In the integrated circuit device 100B of the present embodiment, the bit line electrode layer 460 is disposed on the amorphous metal layer 240. A MoW alloy may be used as a material for forming the bit line electrode layer 460. In particular, the MoW alloy used for the bit line electrode layer 460 may be a superlattice alloy including a plurality of molybdenum layers 461 and a plurality of tungsten layers 462 alternately disposed. In the MoW superlattice alloy, Mo may account for about 25 at % to about 75 at %. Here, the bit line barrier layer 230, the amorphous metal layer 240, and the bit line electrode layer 460 may constitute the bit line BL.

In the integrated circuit device 100B of this embodiment, a lowermost layer (first layer) among the plurality of molybdenum layers 461 and the plurality of tungsten layers 462 may have a thickness of about 0.5 nm to about 10 nm. In comparison, the remaining layers excluding the lowermost layer (the first layer) among the plurality of molybdenum layers 461 and the plurality of tungsten layers 462 may each have a thickness of about 0.5 Å to about 10 Å. That is, the lowermost layer (the first layer) may serve as a seed layer for increasing the orientation and grain size of the bit line electrode layer 460.

As in FIG. 6, when the bit line electrode layer 460 is made of a MoW superlattice alloy, because the formation of the lowermost layer (first layer) may limit and/or suppress the formation of beta W, which has a relatively high resistivity, a lower resistivity than a single layer (e.g., a single molybdenum layer) may be secured. In addition, when the bit line electrode layer 460 is made of a MoW superlattice alloy, a relatively uniform grain size and composition distribution may be secured, and thus corrosion resistance may be excellent.

FIGS. 7 to 14 are cross-sectional views illustrating a method of manufacturing an integrated circuit device according to an embodiment of inventive concepts according to a process sequence.

Figure 7:
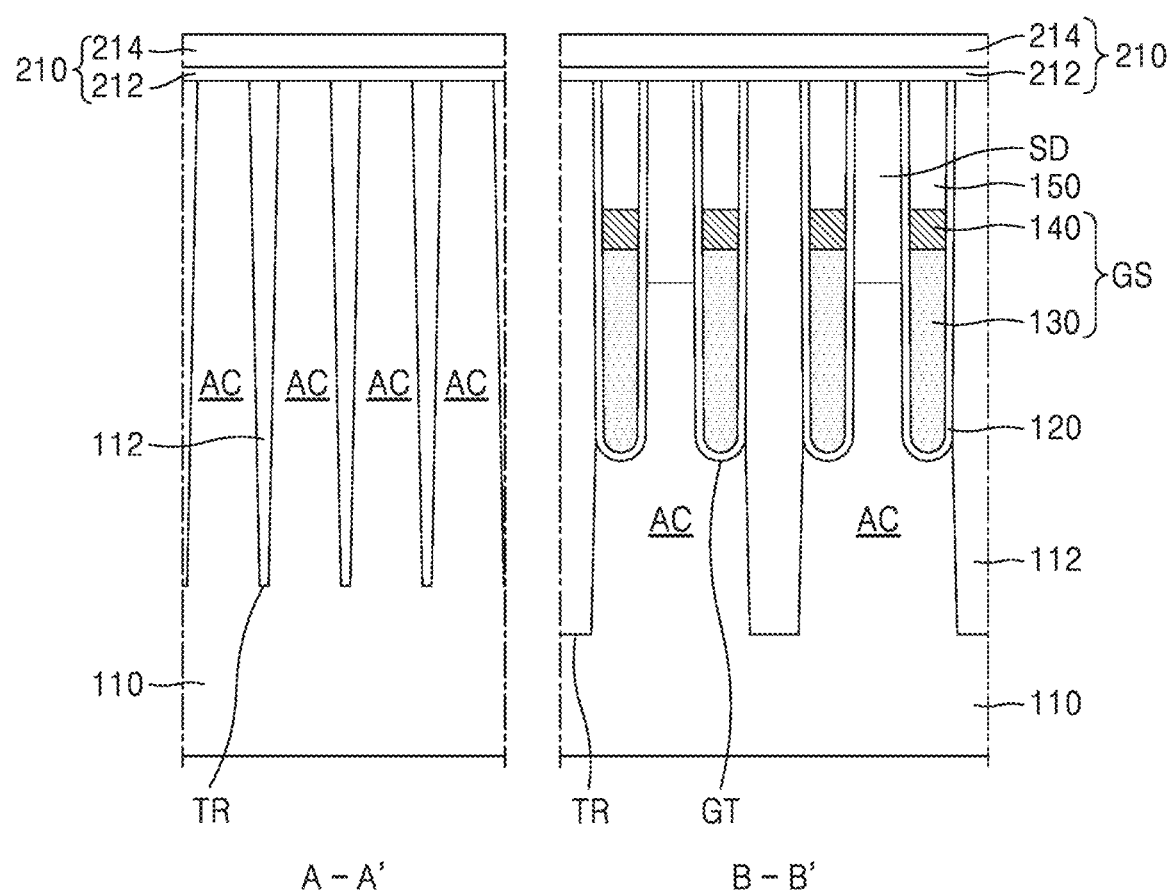
FIGS. 7 to 14 are cross-sectional views illustrating a method of manufacturing an integrated circuit device, according to an embodiment of inventive concepts according to a process sequence.

Referring to FIG. 7, after forming a plurality of device isolation trenches TR in the cell array region of the substrate 110, a plurality of device isolation films 112 filling the plurality of device isolation trenches TR are formed. A plurality of active regions AC may be defined in the cell array region of the substrate 110 by the plurality of device isolation films 112.

The substrate 110 may be a wafer including silicon (Si). In some embodiments, the substrate 110 may be a wafer including a semiconductor element such as germanium (Ge), or a compound semiconductor such as silicon carbide (SiC), gallium arsenide (GaAs), indium arsenide (InAs), or indium phosphide (InP).

After forming a plurality of source/drain regions by implanting impurity ions into upper surfaces of the plurality of active regions AC, a plurality of gate trenches GT extending parallel to each other are formed in the substrate 110. After cleaning the resulting structure including the plurality of gate trenches GT, next a gate dielectric layer 120, a gate structure GS, and a gate capping film 150 are formed in each of the plurality of gate trenches GT. The plurality of gate structures GS may constitute a plurality of word lines.

The gate structure GS may include the gate electrode 130 and the gate protective film 140. The gate electrode 130 may be formed of a metal, a metal nitride, a metal carbide, or a combination thereof. The gate protective film 140 may be formed on the gate electrode 130. Specifically, the gate protective film 140 may be formed between the gate electrode 130 and the gate capping film 150.

Next, an interlayer insulating film 210 may be formed on the substrate 110. The interlayer insulating film 210 may include a first interlayer insulating film 212 and a second interlayer insulating film 214 sequentially formed on the substrate 110. The first interlayer insulating film 212 and the second interlayer insulating film 214 may be made of different types of insulating materials. For example, the first interlayer insulating film 212 may include a silicon oxide film, and the second interlayer insulating film 214 may include a silicon nitride film, but inventive concepts is not limited thereto.

Figure 8:
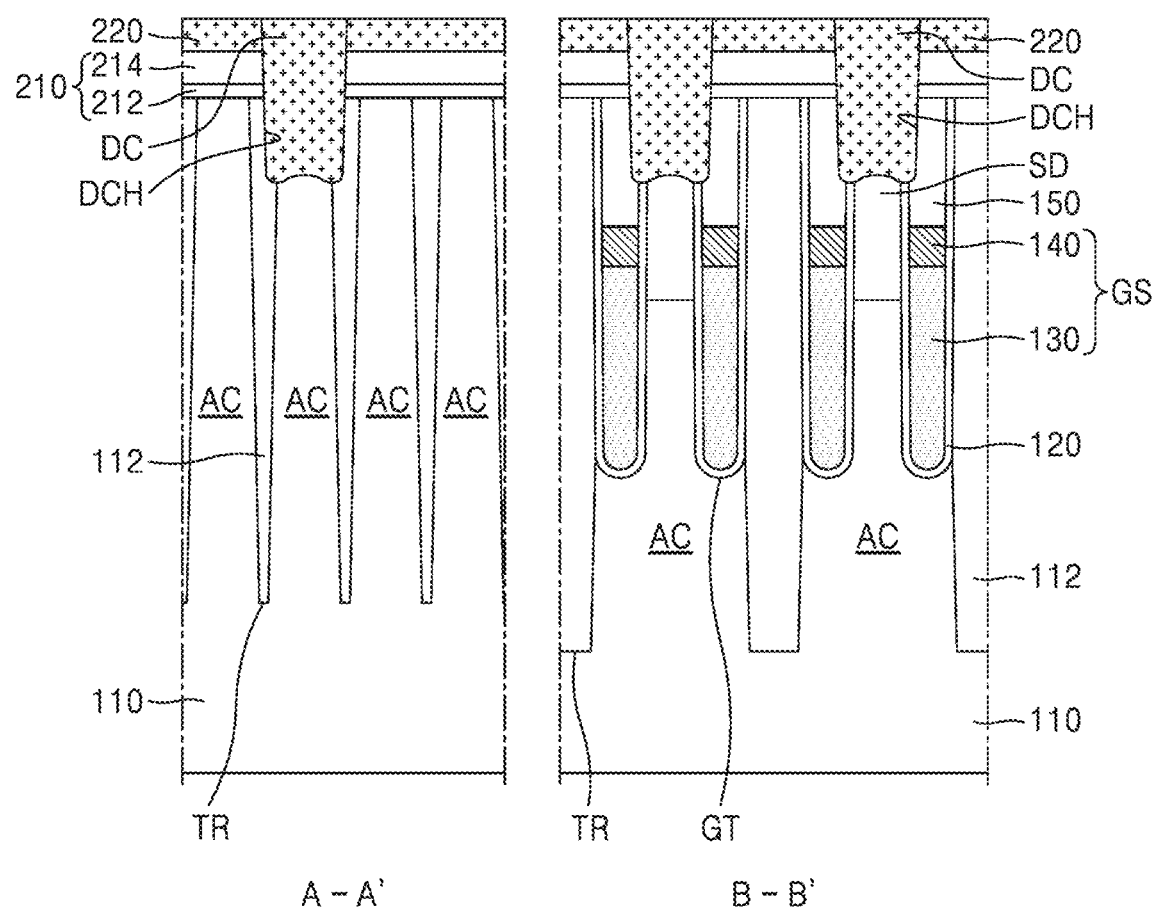

Referring to FIG. 8, after forming the interlayer conductive film 220 on the substrate 110, by etching a partial area of the interlayer insulating film 210 and the interlayer conductive film 220 and a partial area of the substrate 110, a plurality of direct contact holes DCH may be formed through the interlayer insulating film 210 and the interlayer conductive film 220 to expose the active region AC.

The interlayer conductive film 220 may be made of doped polysilicon or a metal such as W, Mo, Au, Cu, Al, Ni, or Co. The interlayer conductive film 220 may include a single layer made of one material selected from among the above example materials, or a multilayer made of a plurality of materials.

A plurality of direct contacts DC may be formed to respectively fill the plurality of direct contact holes DCH. The plurality of direct contacts DC may be formed of doped polysilicon. In some embodiments, the plurality of direct contacts DC may be formed of substantially the same material, although the doping concentration of the direct contacts DC is different from that of the interlayer conductive film 220.

Figure 9:
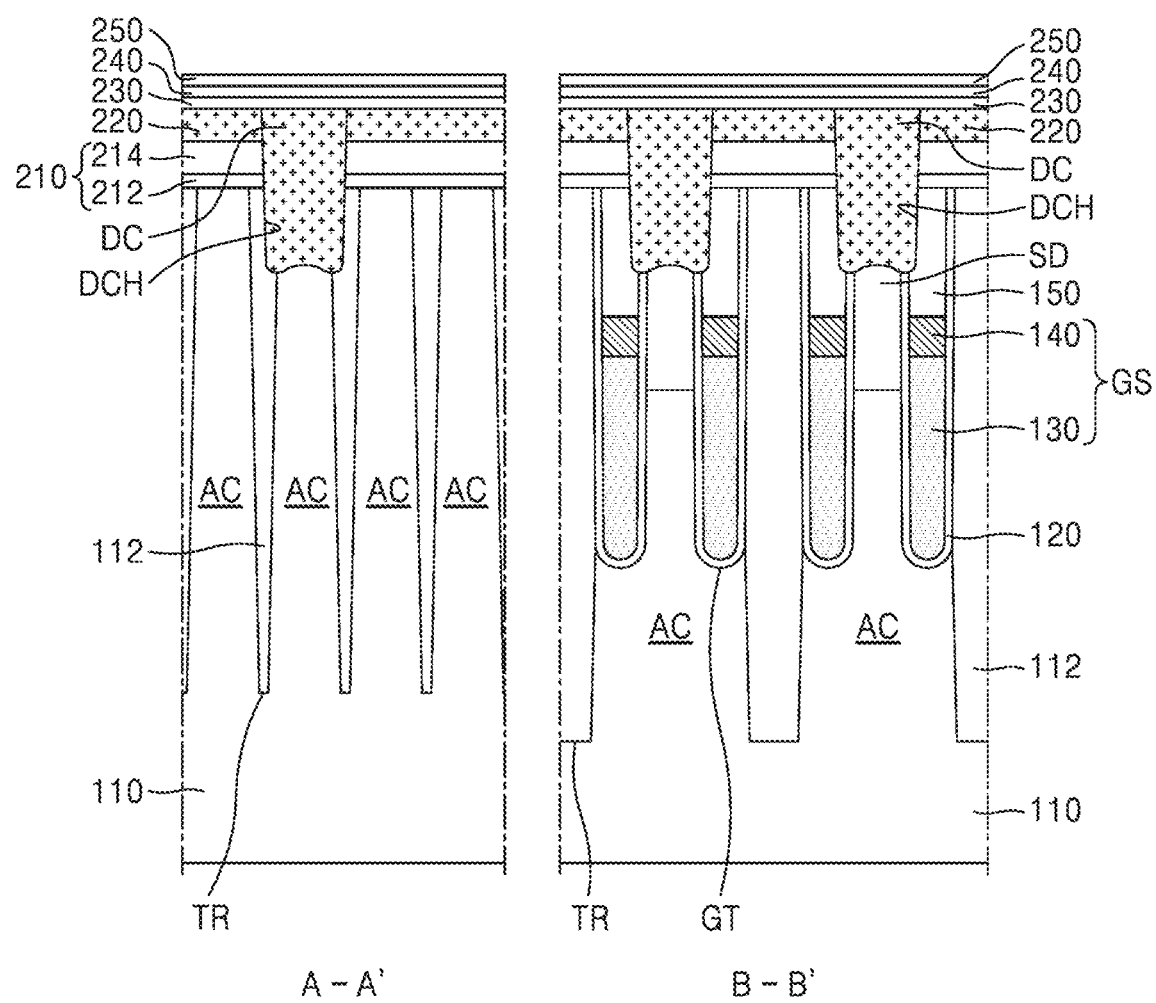

Referring to FIG. 9, a bit line silicide layer (not shown), a bit line barrier layer 230, an amorphous metal layer 240, and a seed layer 250 may be sequentially formed on the interlayer conductive film 220.

The bit line silicide layer (not shown) may be formed of metal silicide. Moreover, the bit line barrier layer 230 may be formed of TiSiN, TiN, TaN, CoN, metal, metal silicide, or a combination thereof. The metal and the metal silicide may include W, Mo, Au, Cu, Al, Ni, or Co, but inventive concepts is not limited thereto.

Next, the amorphous metal layer 240 and the seed layer 250 may be sequentially included on the bit line barrier layer 230. The amorphous metal layer 240 and the seed layer 250 may be additional material layers to efficiently grow a metal material constituting the bit line electrode layer 260. In some embodiments, the amorphous metal layer 240 and the seed layer 250 may be omitted.

The amorphous metal layer 240 may be any one selected from $WB_x$, $MoB_x$, $MoWB_x$, $TaB_x$, $NbB_x$, $HfB_x$, $ZrB_x$, and $CoB_x$ In order to efficiently control the orientation and grain size of the seed layer 250 disposed on the amorphous metal layer 240, the amorphous metal layer 240 may be formed to a thickness of about 0.5 nm to about 5 nm.

The seed layer 250 may be any one selected from Mo, W, MoW, MoTa, and MoWTa. In order to efficiently control the orientation and grain size of the bit line electrode layer 260 disposed on the seed layer 250, the seed layer 250 may be formed to a thickness of about 1 nm to about 10 nm.

Figure 10:
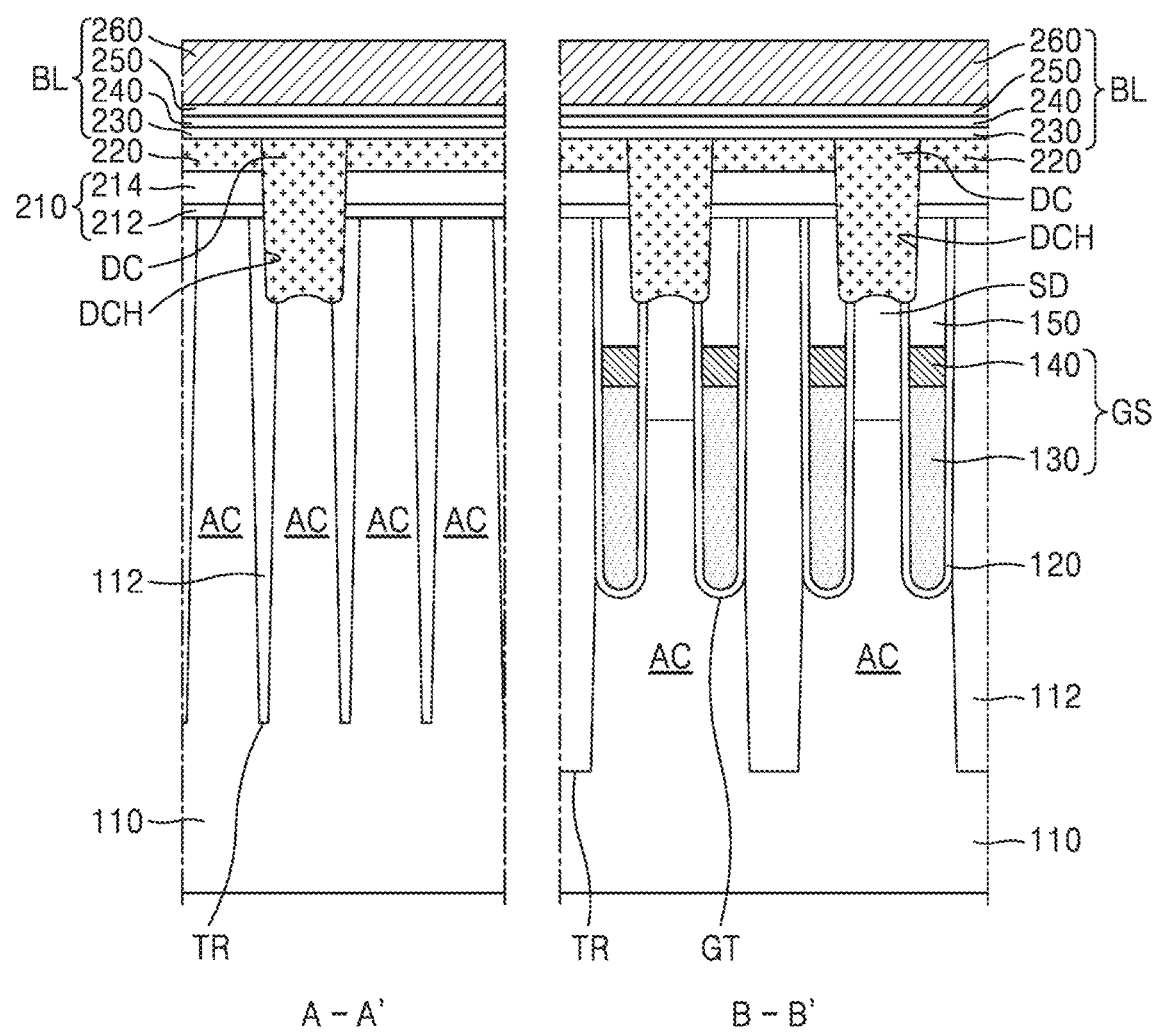

Referring to FIG. 10, a bit line electrode layer 260 may be formed on the seed layer 250 using a MoW alloy.

The bit line electrode layer 260 may be formed of a MoW alloy, which is a binary perfect solid solution. The MoW alloy may be formed by a physical vapor deposition (PVD) method, a chemical vapor deposition (CVD) method, or an atomic layer deposition (ALD) method, and may be selectively used considering particular resistance characteristics, surface roughness, corrosion resistance, and the like. In some embodiments, when forming the bit line electrode layer 260 by a PVD method, the forming temperature may be formed at a high temperature in a range of about 200° C. to about 550° C. to increase orientation and grain size. In other embodiments, when forming the bit line electrode layer 260 by a VD method or an ALD method, the forming temperature may be formed at a high temperature ranging from about 200° C. to about 750° C. to increase orientation and grain size.

The thickness of the MoW alloy used as the bit line electrode layer 260 may be adjusted in a range of about 10 nm to about 30 nm considering the resistance, capacitance, and process difficulty of the metal wiring.

After the bit line electrode layer 260 is formed, in order for grain regrowth or impurity removal of MoW alloys, an inert gas or hydrogen ($H_2$) atmosphere annealing may be performed in a range of about 400° C. to about 1200° C.

Although not shown in the drawing, to limit and/or prevent surface oxidation and surface nitridation of a MoW alloy, it is also possible to form a MoW alloy and form an in-situ capping layer in the same facility. As a material constituting the in-situ capping layer, graphene, which is stable at high temperatures and has excellent protection against contamination during subsequent processing, may be used.

Figure 11:
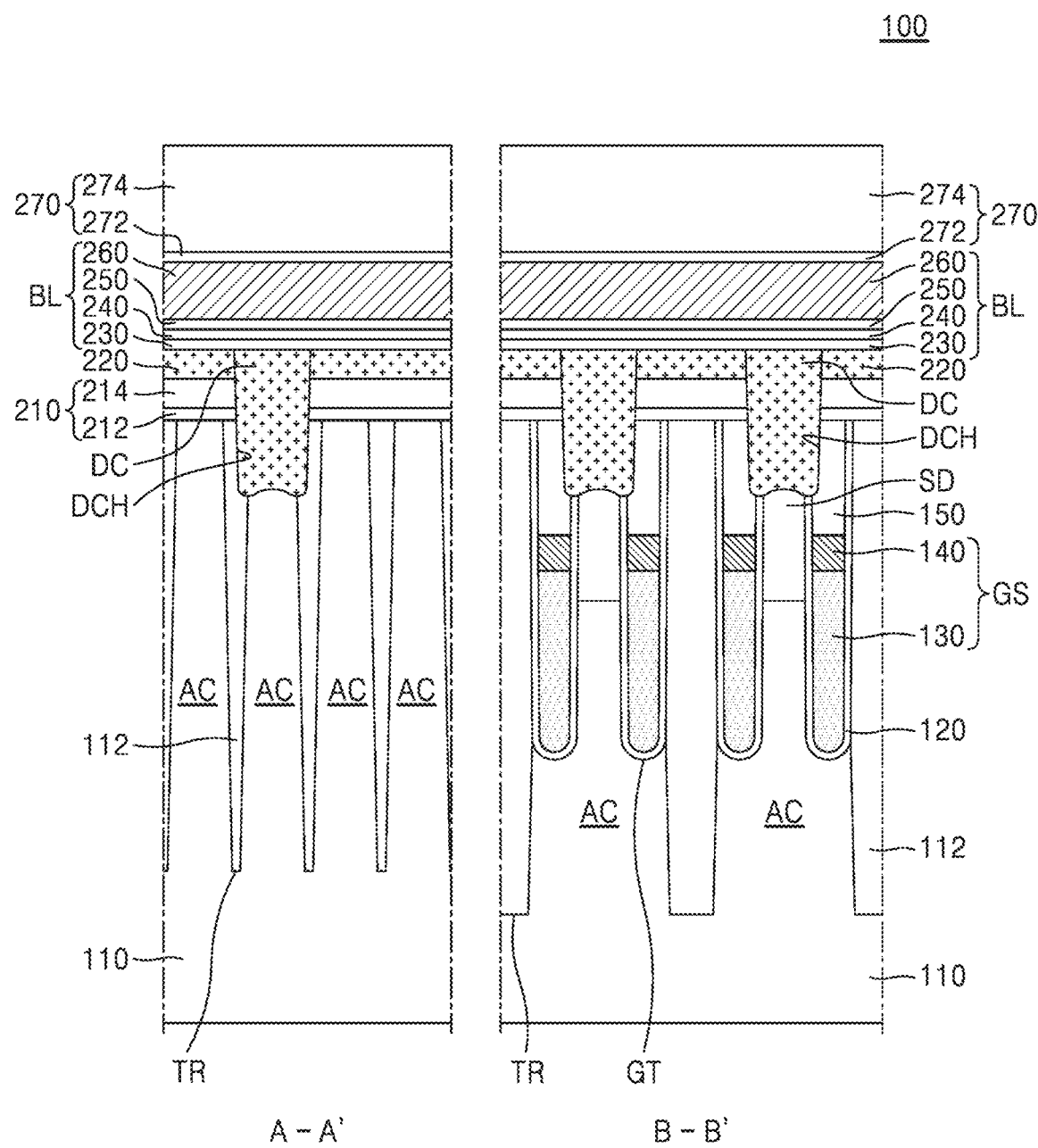

Referring to FIG. 11, a bit line capping layer 270 may be formed on the bit line electrode layer 260.

The bit line capping layer 270 may include a first bit line capping layer 272 and a second bit line capping layer 274 sequentially formed on the bit line electrode layer 260. The second bit line capping layer 274 may be formed to be thicker than the first bit line capping layer 272.

In some embodiments, the first bit line capping layer 272 and the second bit line capping layer 274 may be formed of the same type of insulating material. For example, the first bit line capping layer 272 and the second bit line capping layer 274 may include a silicon nitride layer.

In other embodiments, the first bit line capping layer 272 and the second bit line capping layer 274 may be formed of different types of insulating materials. For example, the first bit line capping layer 272 may include a silicon oxide film, and the second bit line capping layer 274 may include a silicon nitride film.

Accordingly, the manufacturing process of the main configuration of the integrated circuit device 100 according to the embodiment of inventive concepts has been described. Hereinafter, a subsequent process of the integrated circuit device 100 will be described.

Figure 12:
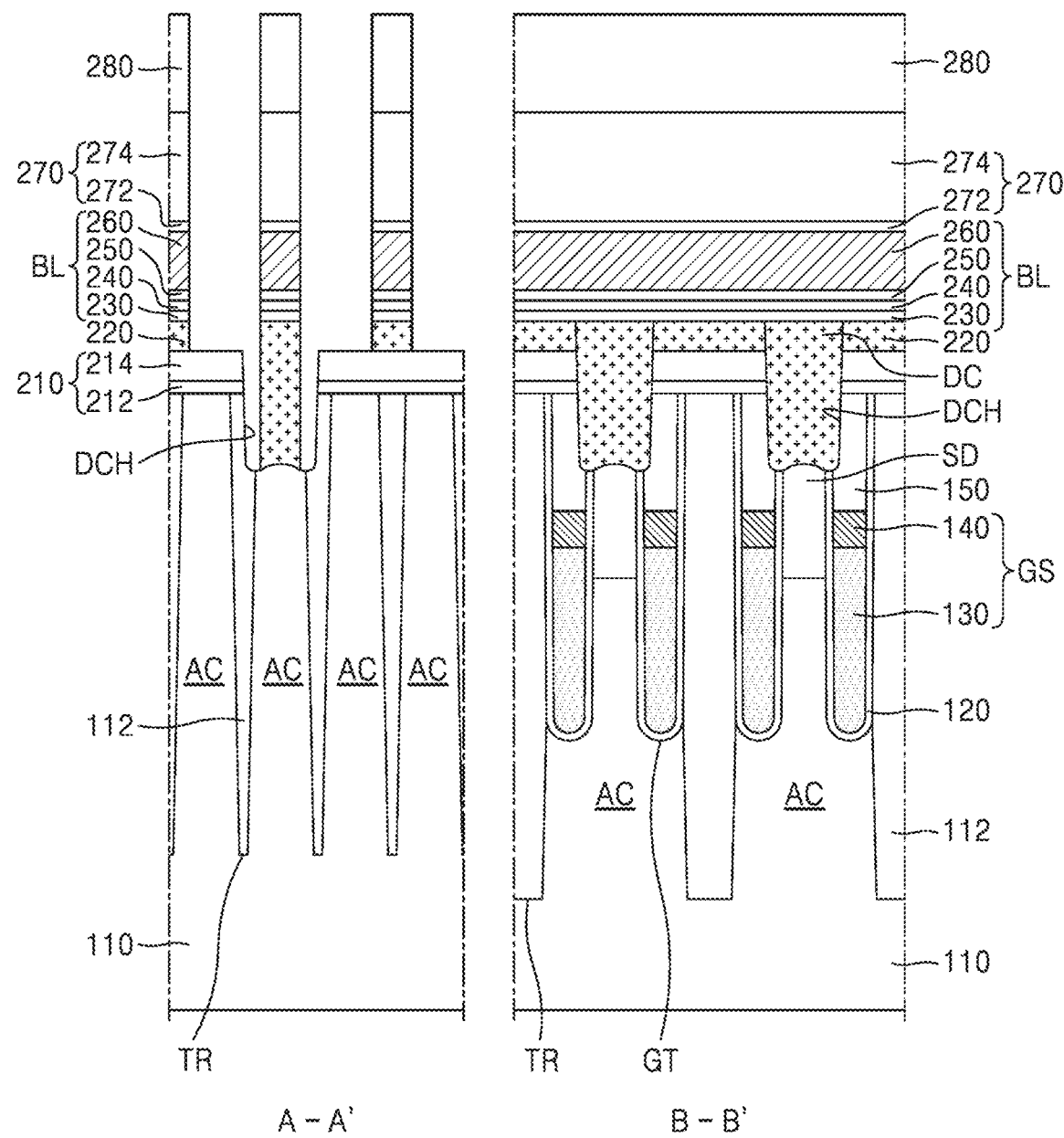

Referring to FIG. 12, a hard mask pattern 280 may be formed on the bit line capping layer 270. A portion of the upper surface of the bit line capping layer 270 may be exposed through the hard mask pattern 280. The hard mask pattern 280 may include a silicon nitride film.

By etching the stacked structure including the direct contact DC, the interlayer insulating film, the interlayer conductive film 220, the bit line barrier layer 230, the amorphous metal layer 240, the seed layer 250, the bit line electrode layer 260, and the bit line capping layer 270 using the hard mask pattern 280 as an etch mask, a plurality of spaced apart structures extending parallel to each other are formed. Here, the bit line barrier layer 230, the amorphous metal layer 240, the seed layer 250, and the bit line electrode layer 260 may constitute the bit line BL.

Figure 13:
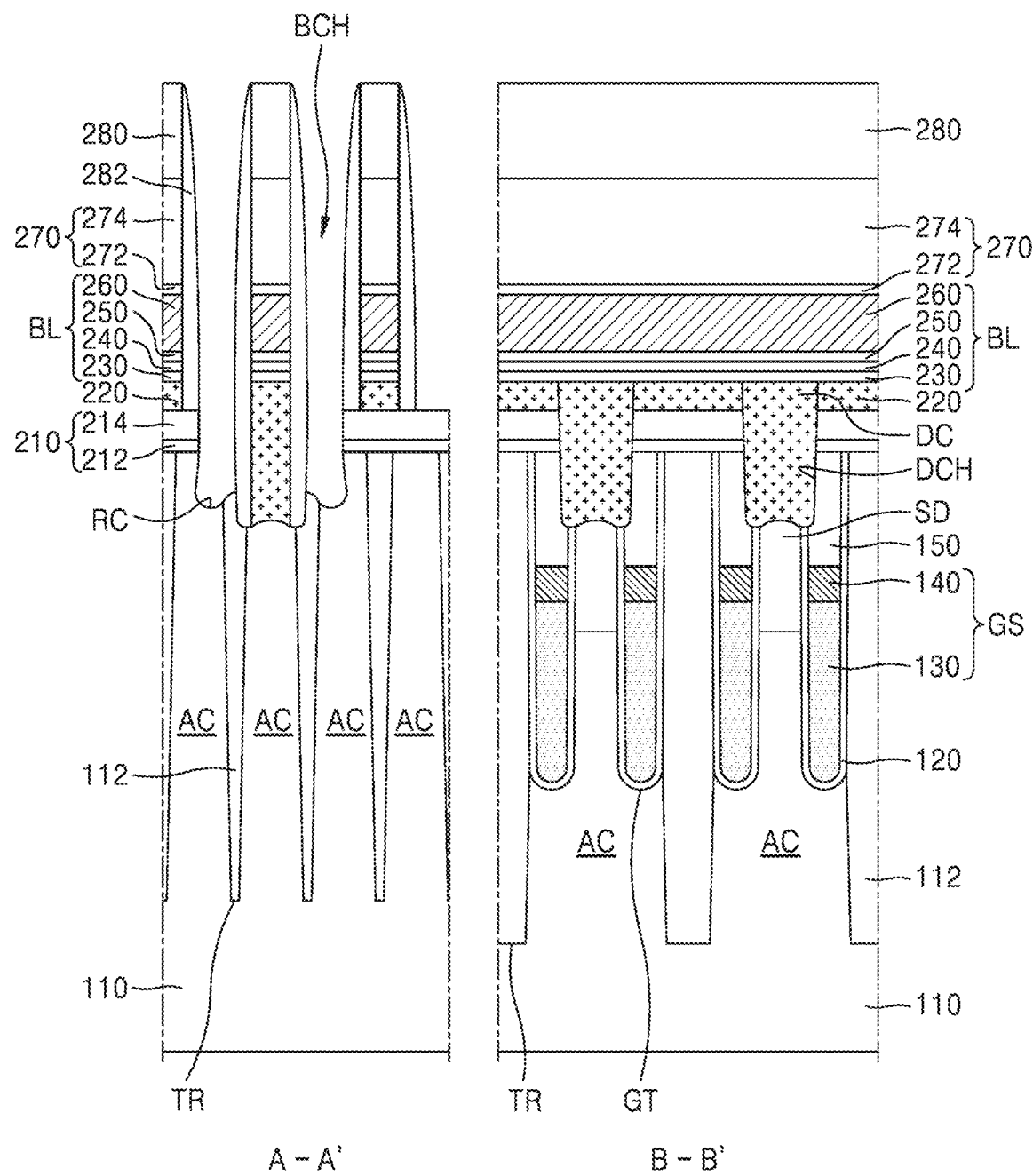

Referring to FIG. 13, a plurality of spacers 282 covering both sidewalls of each of the plurality of bit lines BL are formed, and a portion of the substrate 110 exposed through the plurality of spacers 282 and a portion of the device isolation film 112 are etched to form a plurality of recesses RC exposing the plurality of active regions AC.

The plurality of recesses RC may communicate with a buried contact hole BCH having a width that is defined by a pair of spacers 282 between adjacent bit lines BL.

To form a plurality of spacers 282 and a plurality of recesses RC, an insulating film for forming spacers covering the plurality of bit lines BL is formed, and a process of etching back the insulating film for forming spacers and a process of etching a part of the substrate 110 and a part of the device isolation film 112 may be performed.

Figure 14:
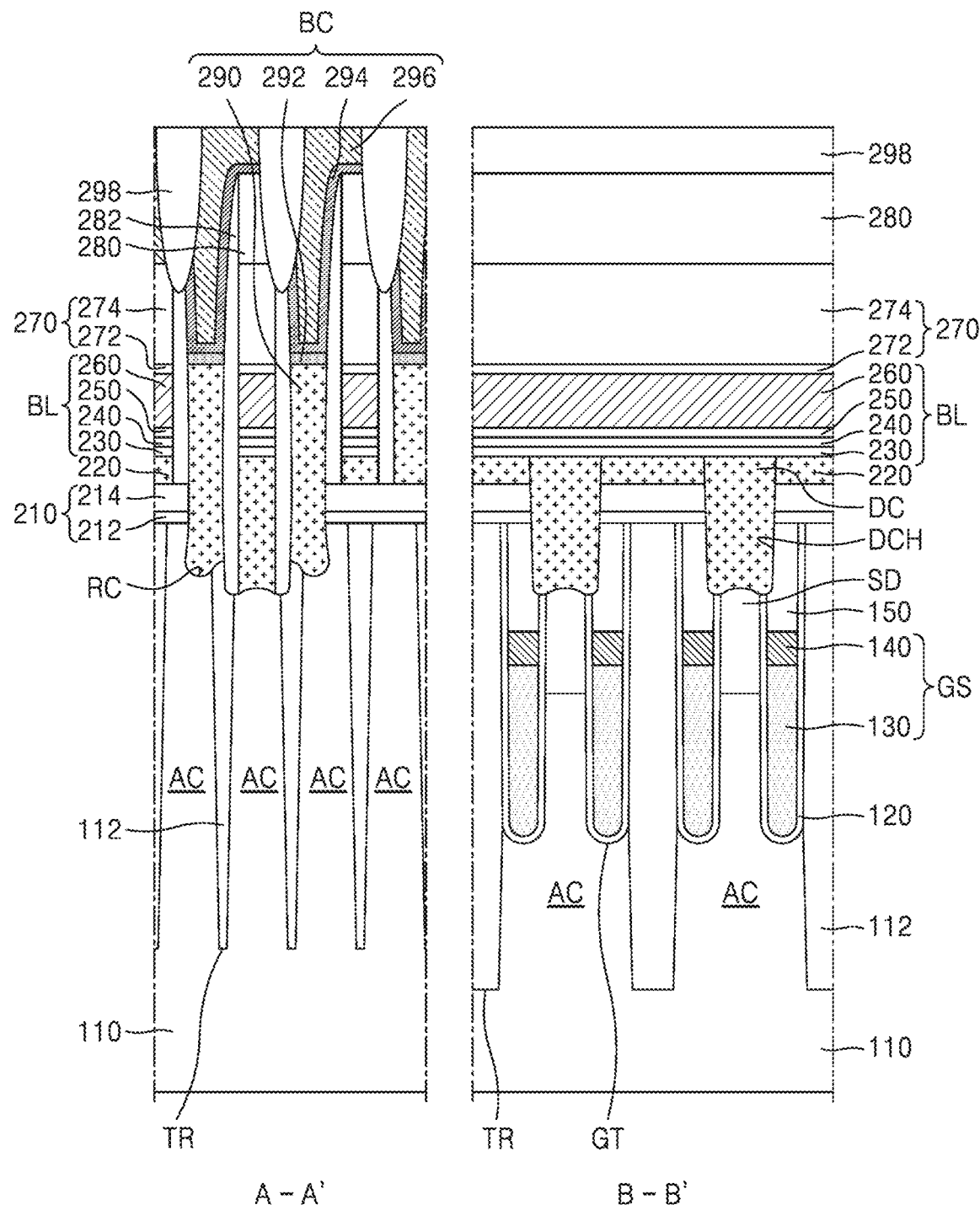

Referring to FIG. 14, while filling the plurality of recesses RC between each of the plurality of bit lines BL, a buried conductive film 290, a buried silicide film 292, a conductive barrier film 294, and an upper conductive film 296 that are sequentially stacked in the plurality of buried contact holes BCH may be formed.

The buried conductive film 290, the buried silicide film 292, the conductive barrier film 294, and the upper conductive film 296 may form a buried contact BC.

An extended portion of the plurality of upper conductive films 296 may be used as a plurality of landing pads to which a lower electrode (not shown) of a capacitor formed in a subsequent process may be connected.

The plurality of buried conductive films 290 may be formed by CVD, PVD, or an epitaxial growth process. The plurality of buried conductive films 290 may be formed of a semiconductor material doped with impurities, a metal, a conductive metal nitride, a metal silicide, or a combination thereof.

The plurality of buried silicide layers 292 may be formed of cobalt (Co) silicide, nickel (Ni) silicide, or manganese (Mn) silicide. In some embodiments, the buried silicide layer 292 may be omitted.

The plurality of conductive barrier layers 294 may have a Ti/TiN stack structure.

The plurality of upper conductive films 296 may be formed of doped polysilicon, metal, metal silicide, conductive metal nitride, or a combination thereof. For example, the plurality of upper conductive films 296 may include W. The plurality of upper conductive films 296 may be electrically insulated by the upper insulating film 298 filling the space around them.

Next, a plurality of capacitor lower electrodes (not shown) electrically connectable to the plurality of upper conductive films 296 may be formed on the upper insulating film 298.

In the integrated circuit device 100 of inventive concepts manufactured by such a manufacturing method, by applying a MoW alloy to the bit line electrode layer 260, electrical characteristics, process easiness, and price competitiveness may be achieved. As a result, in inventive concepts, a MoW alloy is applied as a material constituting the bit line BL in the ultra-fine metal wiring process of the integrated circuit device 100, so that it is possible to limit and/or prevent rapid resistance increase due to corrosion occurring in W single metal.

Ultimately, according to inventive concepts, in an integrated circuit device 100 including a buried channel array transistor, by using a MoW alloy as a metal material constituting the bit line electrode layer 260, the effect of improving electrical characteristics and product reliability may be achieved.

Figure 15:
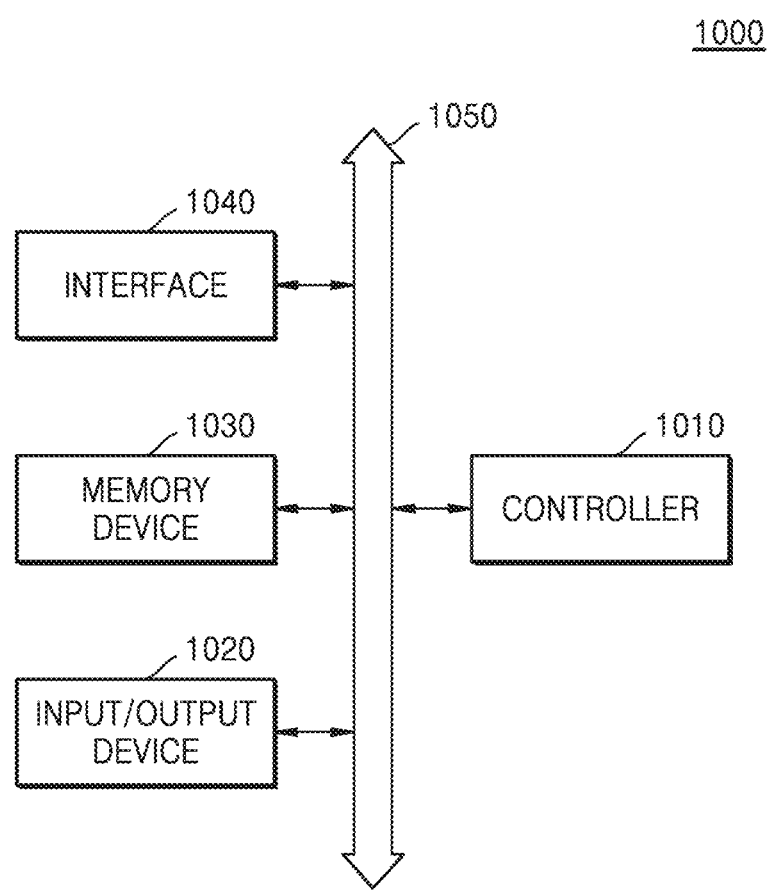
FIG. 15 is a block diagram illustrating a system including an integrated circuit device according to an embodiment of inventive concepts.

FIG. 15 is a block diagram illustrating a system including an integrated circuit device according to an embodiment of inventive concepts.

Referring to FIG. 15, a system 1000 includes a controller 1010, an input/output device 1020, a memory device 1030, an interface 1040, and a bus 1050.

The system 1000 may be a mobile system or a system that transmits or receives information. In some embodiments, the mobile system may be a portable computer, a web tablet, a mobile phone, a digital music player, or a memory card.

The controller 1010 is for controlling an executable program in the system 1000, and may include a microprocessor, a digital signal processor, a microcontroller, or a similar device.

The input/output device 1020 may be used to input or output data of the system 1000. The system 1000 may be connected to an external device, for example, a personal computer or a network, using the input/output device 1020, and may exchange data with the external device. The input/output device 1020 may be, for example, a touch screen, a touch pad, a keyboard, or a display.

The memory device 1030 may store data for the operation of the controller 1010 or store data processed by the controller 1010. The memory device 1030 may include any one of the integrated circuit devices 100, 100A, and 100B according to inventive concepts described above.

The interface 1040 may be a data transmission path between the system 1000 and an external device. The controller 1010, the input/output device 1020, the storage device 1030, and the interface 1040 may communicate with each other via the bus 1050.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concepts have been particularly shown and described with reference to embodiments thereof, it will be understood that various changes in form and details may be made therein without departing from the spirit and scope of the following claims.

What is claimed is:

1. An integrated circuit device comprising:
a plurality of gate structures embedded in a substrate;
a direct contact on the substrate between the plurality of gate structures; and
a bit line electrode layer on the direct contact,
wherein the bit line electrode layer has a thickness of about 10 nm to 30 nm, and
the bit line electrode layer comprises a molybdenum tungsten (MoW) alloy including molybdenum (Mo) in a range of about 25 at % to about 75 at %.

2. The integrated circuit device of claim 1, further comprising:
a seed layer under the bit line electrode layer,
wherein the seed layer is one of Mo, W, MoW, MoTa, and MoWTa.

3. The integrated circuit device of claim 2, wherein
a thickness of the seed layer ranges from about 1 nm to about 10 nm, and
the seed layer increases an orientation of bit line electrode layer and a grain size of the bit line electrode layer.

4. The integrated circuit device of claim 2, further comprising:
an amorphous metal layer under the seed layer, wherein
a thickness of the amorphous metal layer ranges from about 0.5 nm to about 5 nm, and
the amorphous metal layer is one of $WB_x$, $MoB_x$, $MoWB_x$, $TaB_x$, $NbB_x$, $HfB_x$, $ZrB_x$, and $CoB_x$.

5. The integrated circuit device of claim 1, further comprising:
a bit line silicide layer; and
a bit line barrier layer, wherein
the direct contact comprises polysilicon,
the bit line silicide layer and the bit line barrier layer are between the direct contact and the bit line electrode layer.

6. The integrated circuit device of claim 1, further comprising:
a bit line bonding layer between the direct contact and the bit line electrode layer, wherein
the direct contact is a metal material.

7. The integrated circuit device of claim 6, further comprising:
a contact silicide layer and a contact barrier layer between a bottom surface of the direct contact and the substrate.

8. The integrated circuit device of claim 6, wherein the metal material is one of Mo, W, MoW, and TiN.

9. The integrated circuit device of claim 1, wherein a method of forming the MoW alloy constituting the bit line electrode layer comprises a forming process performed in a range of about 200° C. to about 750° C.

10. The integrated circuit device of claim 9, wherein the method of forming the MoW alloy constituting the bit line electrode layer further includes an annealing process performed in a range of about 400° C. to about 1200° C.

11. An integrated circuit device comprising:
a plurality of gate structures embedded in a substrate;
a direct contact on the substrate between the plurality of gate structures; and
a bit line electrode layer on the direct contact,
wherein the bit line electrode layer is a superlattice alloy including a plurality of molybdenum (Mo) layers and a plurality of tungsten (W) layers alternately disposed,
wherein the superlattice alloy includes Mo in a range from about 25 at % to about 75 at %.

12. The integrated circuit device of claim 11, wherein a lowermost layer among the plurality of Mo layers and the plurality of W layers has a thickness of about 0.5 nm to about 10 nm.

13. The integrated circuit device of claim 12, wherein among the plurality of Mo layers and the plurality of W layers, remaining layers except for the lowermost layer each have a thickness of about 0.5 Å to about 10 Å.

14. The integrated circuit device of claim 12, wherein the lowermost layer increases an orientation of the bit line electrode layer and a grain size of the bit line electrode layer.

15. The integrated circuit device of claim 11, further comprising:
a bit line silicide layer; and
a bit line barrier layer, wherein
the direct contact is made of polysilicon,
the bit line silicide layer and the bit line barrier layer are between the direct contact and the bit line electrode layer.

16. The integrated circuit device of claim 11, further comprising:
a bit line bonding layer between the direct contact and the bit line electrode layer, wherein
the direct contact is a metal material.

17. The integrated circuit device of claim 16, further comprising:
a contact silicide layer; and
a contact barrier layer, wherein
the contact silicide layer and the contact barrier layer are between a bottom surface of the direct contact and the substrate.

18. The integrated circuit device of claim 16, wherein the metal material is one of Mo, W, MoW, and TiN.

19. An integrated circuit device comprising:
a plurality of gate structures embedded in a substrate;
a direct contact on the substrate and vertically aligned with the substrate between the plurality of gate structures; and
a bit line structure on the direct contact, wherein
the bit line structure includes a bit line barrier layer, a bit line electrode layer, and a bit line capping layer, and
each of the plurality of gate structures includes a gate trench in the substrate, a gate insulating layer conformally on an inner wall of the gate trench, a gate electrode pattern on the gate insulating layer and filling a lower region of the gate trench, and a gate capping layer on the gate insulating layer and filling an upper region of the gate trench,
wherein the bit line electrode layer has a thickness of about 10 nm to about 30 nm, and the bit line electrode layer includes a molybdenum tungsten (MoW) alloy including molybdenum (Mo) in a range of about 25 at % to about 75 at %.

20. The integrated circuit device of claim 19, further comprising:
a seed layer under the bit line electrode layer; and
an amorphous metal layer under the bit line electrode layer,
wherein the seed layer is one of Mo, W, MoW, MoTa, and MoWTa,
wherein the amorphous metal layer is one of $WB_x$, $MoB_x$, $MoWB_x$, $TaB_x$, $NbB_x$, $HfB_x$, $ZrB_x$, and $CoB_x$,
wherein the seed layer and the amorphous metal layer increase an orientation of the bit line electrode layer and a grain size of the bit line electrode layer.

* * * * *